US012641995B2

(12) United States Patent
Aoki et al.

(10) Patent No.: US 12,641,995 B2
(45) Date of Patent: May 26, 2026

(54) DISPLAY DEVICE AND MANUFACTURING METHOD OF THE SAME

(71) Applicant: Magnolia White Corporation, Tokyo (JP)

(72) Inventors: Hayata Aoki, Tokyo (JP); Masumi Nishimura, Tokyo (JP); Hiroumi Kinjo, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 490 days.

(21) Appl. No.: 18/364,478

(22) Filed: Aug. 3, 2023

(65) Prior Publication Data

US 2024/0023392 A1 Jan. 18, 2024

Related U.S. Application Data

(63) Continuation of application No. PCT/JP2022/000023, filed on Jan. 4, 2022.

(30) Foreign Application Priority Data

Feb. 5, 2021 (JP) ................................. 2021-017412

(51) Int. Cl.
*H10K 77/10* (2023.01)
*H10K 59/12* (2023.01)
(Continued)

(52) U.S. Cl.
CPC ....... *H10K 77/111* (2023.02); *H10K 59/1201* (2023.02); *H10K 59/122* (2023.02); *H10K 59/131* (2023.02); *H10K 59/12* (2023.02)

(58) Field of Classification Search
CPC ............. H10K 77/111; H10K 59/1201; H10K 59/122; H10K 59/131; H10K 59/12;
(Continued)

(56) References Cited

U.S. PATENT DOCUMENTS

2004/0160170 A1 8/2004 Sato et al.
2009/0009069 A1 1/2009 Takata
(Continued)

FOREIGN PATENT DOCUMENTS

JP 2000-195677 A 7/2000
JP 2004-207217 A 7/2004
(Continued)

OTHER PUBLICATIONS

International Search Report and Written Opinion mailed on Mar. 29, 2022, received for PCT Application PCT/JP2022/000023, filed on Jan. 4, 2022, 9 pages including English Translation.

*Primary Examiner* — J. E. Schoenholtz
(74) *Attorney, Agent, or Firm* — XSENSUS LLP

(57) ABSTRACT

According to one embodiment, a display device includes a first lower electrode and a second lower electrode, a power supply line, a first organic layer including a light emitting layer and covering the first lower electrode, a second organic layer including a light emitting layer and covering the second lower electrode, a first upper electrode being in contact with the power supply line and covering the first organic layer, a second upper electrode being in contact with the power supply line and covering the second organic layer, and a first inorganic insulating film covering the first upper electrode and the second upper electrode and exposing the power supply line.

8 Claims, 11 Drawing Sheets

(51) Int. Cl.
  *H10K 59/122*   (2023.01)
  *H10K 59/131*   (2023.01)

(58) Field of Classification Search
  CPC .. G09F 9/00; G09F 9/30; H05B 33/02; H05B
      33/04; H05B 33/06; H05B 33/10; H05B
        33/12; H05B 33/22; H05B 33/26
  See application file for complete search history.

(56)       References Cited

U.S. PATENT DOCUMENTS

| | | | |
|---|---|---|---|
| 2016/0118449 A1* | 4/2016 | Sato | H10K 50/805 |
| | | | 257/89 |
| 2017/0154946 A1* | 6/2017 | Ono | G09G 3/3258 |
| 2019/0237527 A1* | 8/2019 | Lee | H10K 59/122 |
| 2021/0091158 A1 | 3/2021 | Kasahara | |
| 2022/0262890 A1* | 8/2022 | Cheng | H10K 59/122 |

FOREIGN PATENT DOCUMENTS

| | | |
|---|---|---|
| JP | 2008-135325 A | 6/2008 |
| JP | 2009-032673 A | 2/2009 |
| JP | 2010-118191 A | 5/2010 |
| WO | 2019/026511 A1 | 2/2019 |

\* cited by examiner

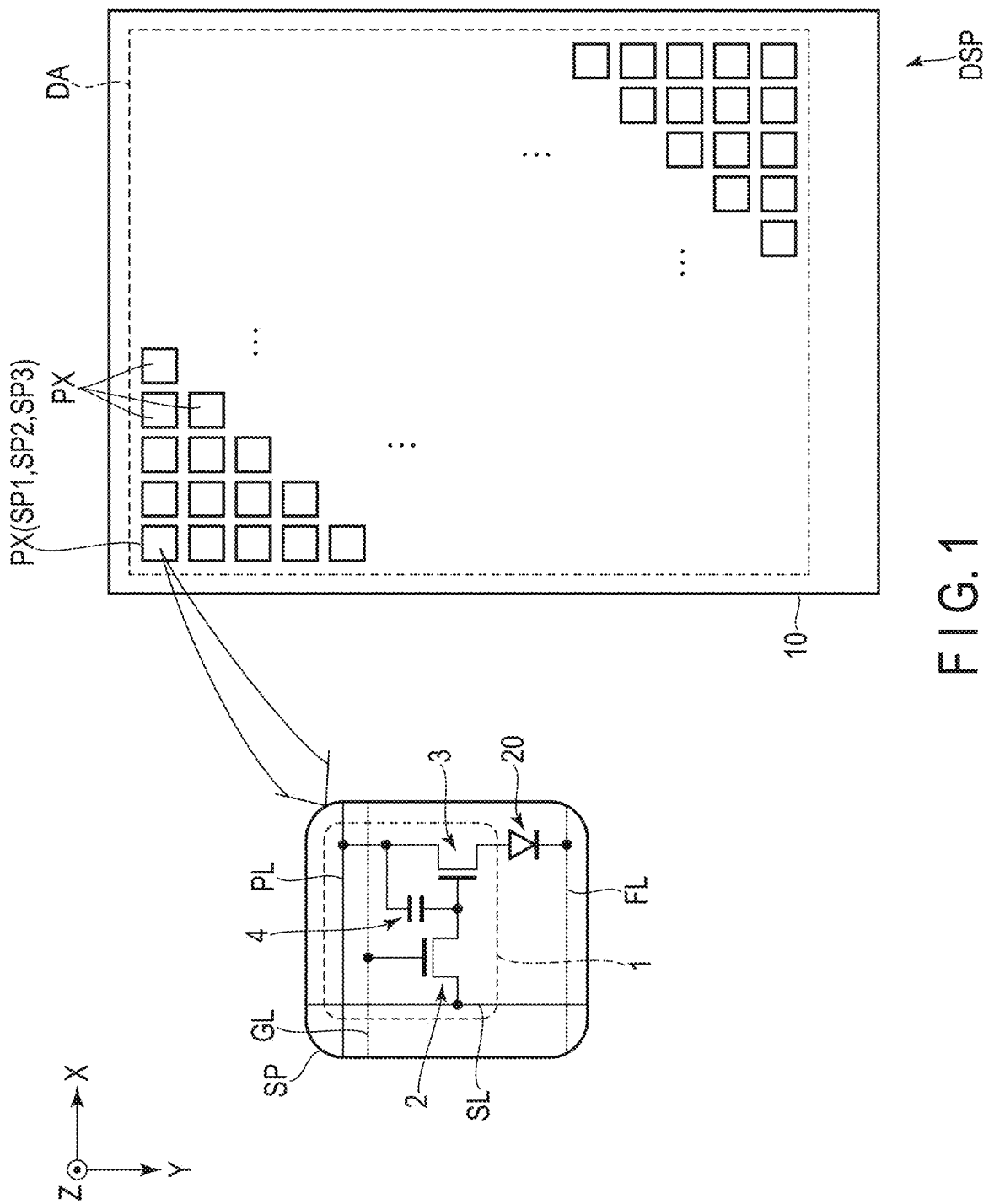
F I G. 1

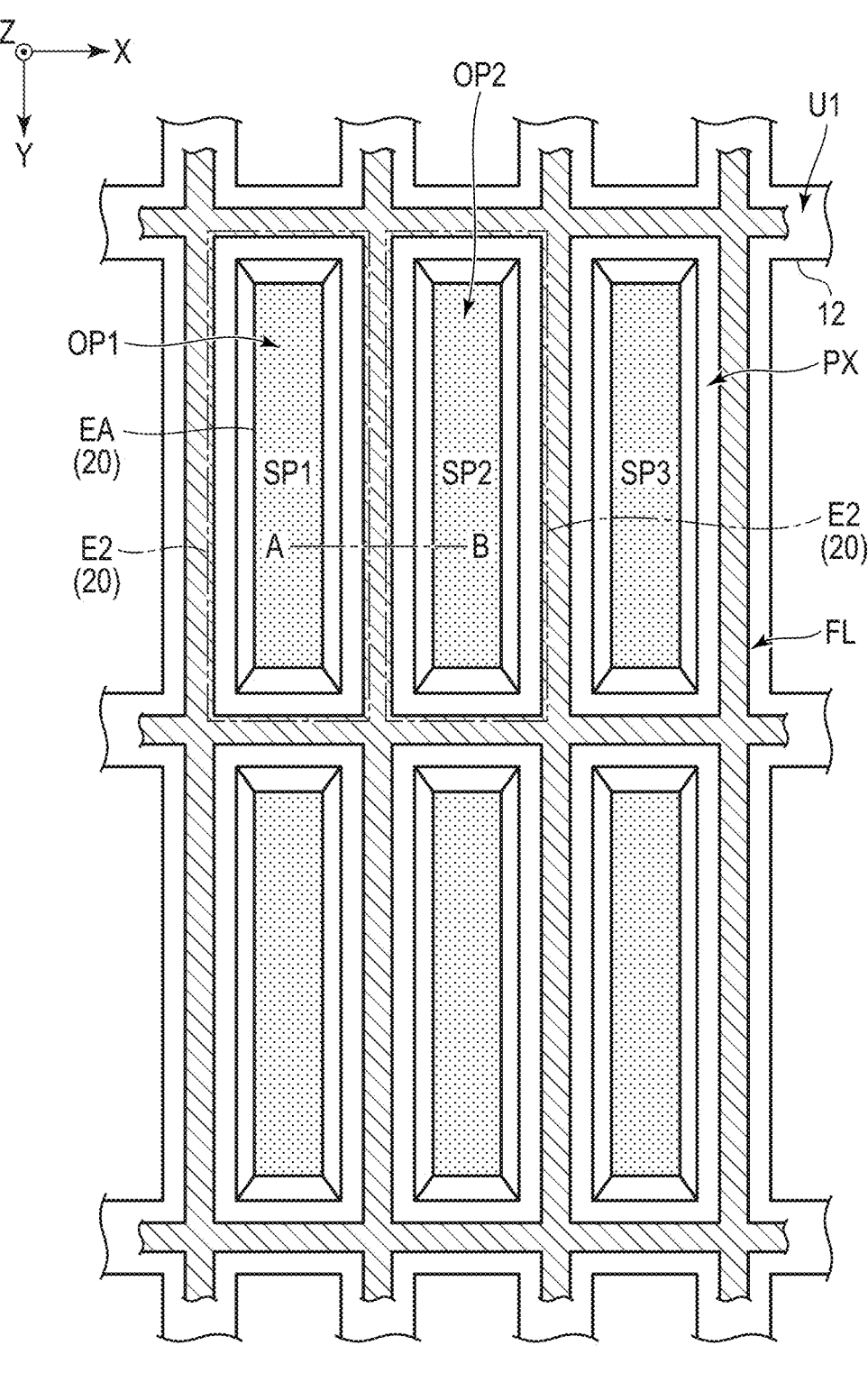
F I G. 3

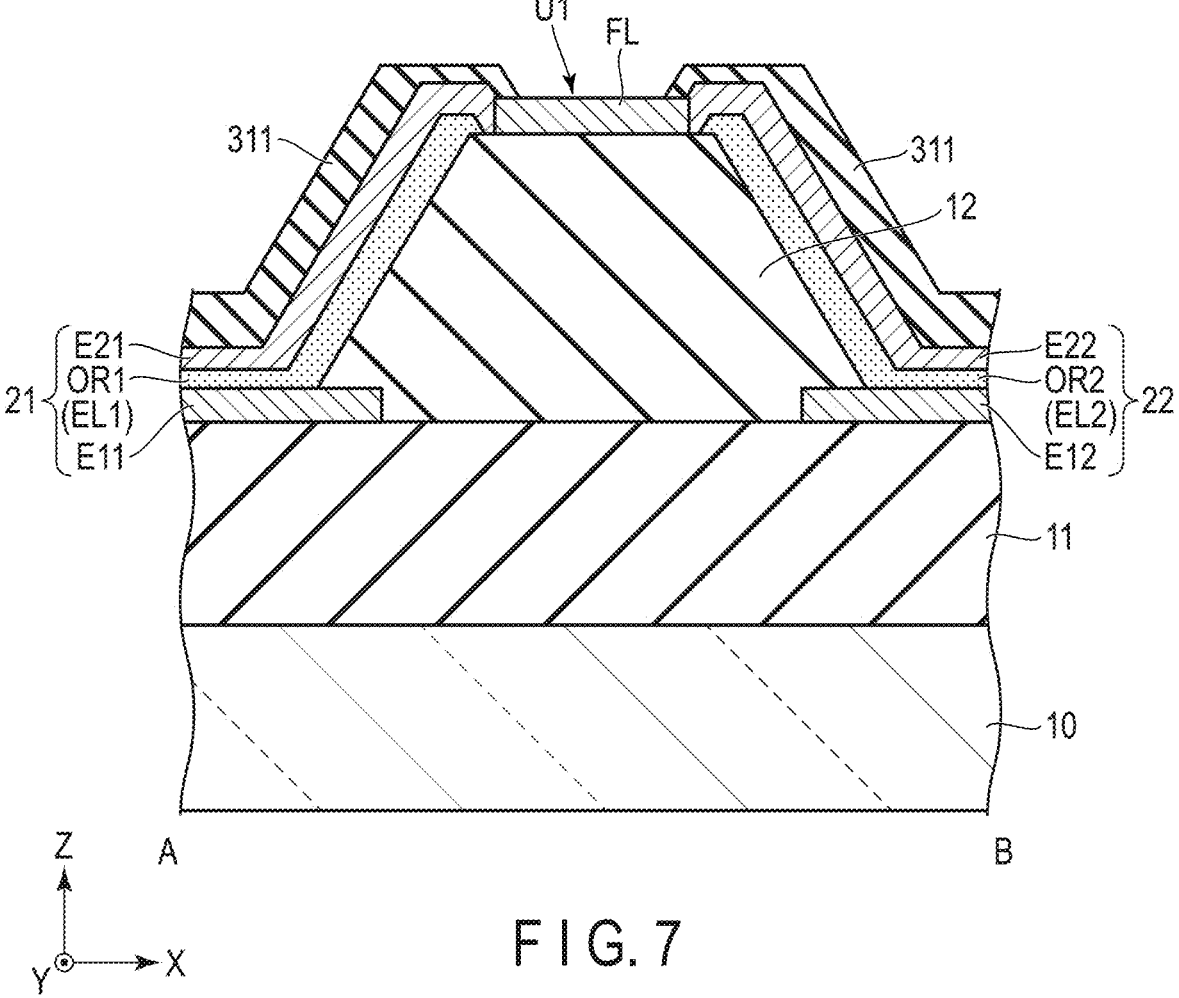
F I G. 7

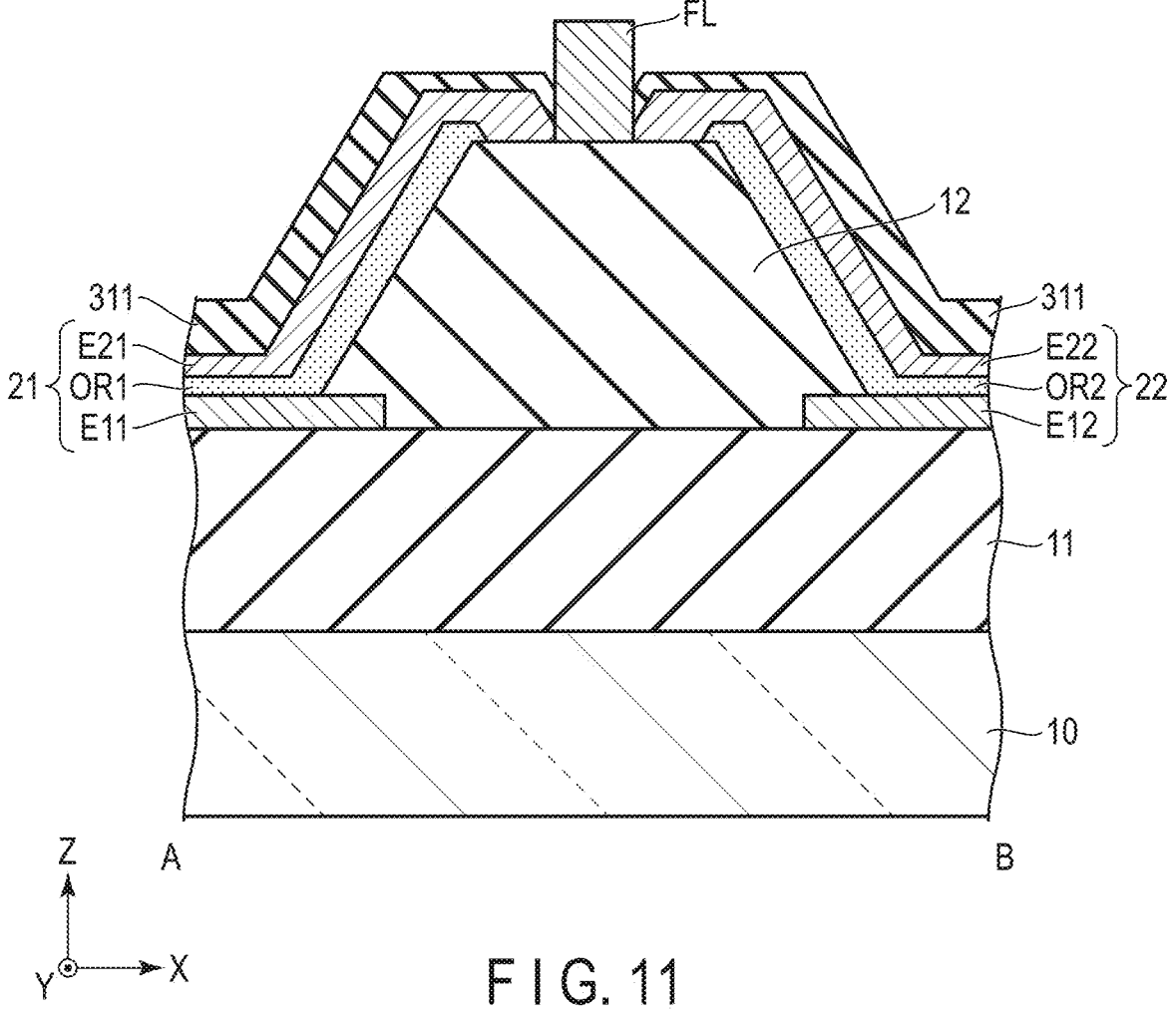
F I G. 11

DISPLAY DEVICE AND MANUFACTURING METHOD OF THE SAME

CROSS-REFERENCE TO RELATED APPLICATIONS

This application is a Continuation Application of PCT Application No. PCT/JP2022/000023, filed Jan. 4, 2022 and based upon and claiming the benefit of priority from Japanese Patent Application No. 2021-017412, filed Feb. 5, 2021, the entire contents of all of which are incorporated herein by reference.

FIELD

Embodiments described herein relate generally to a display device and a display device manufacturing method.

BACKGROUND

Recently, display devices with organic light-emitting diodes (OLEDs) applied thereto as display elements have been put into practical use. Such a display element comprises an organic layer between a pixel electrode and a common electrode. The organic layer includes functional layers such as a hole-transport layer and an electron-transport layer in addition to a light emitting layer. Such an organic layer is formed by, for example, vacuum vapor deposition.

For example, in mask deposition, a fine mask including apertures corresponding to respective pixels is applied. However, formation accuracy of a thin film formed by deposition may be degraded due to processing accuracy of the fine mask, deformation of the aperture shape, and the like. For this reason, forming an organic layer in a desired shape without applying a fine mask is requested.

As an example, a technology of dividing an organic layer and a cathode (second electrode) using a pixel division structure is known. Suppressing a crack near the pixel division structure with this technology is required.

BRIEF DESCRIPTION OF THE DRAWINGS

FIG. 1 is a view showing a configuration example of a display device DSP according to the embodiment.

FIG. 3 is a plan view showing an example of a pixel PX shown in FIG. 1.

FIG. 7 is a view illustrating a method of manufacturing the display device DSP.

FIG. 11 is a view illustrating a method of manufacturing the display device DSP.

DETAILED DESCRIPTION

Figure 2:
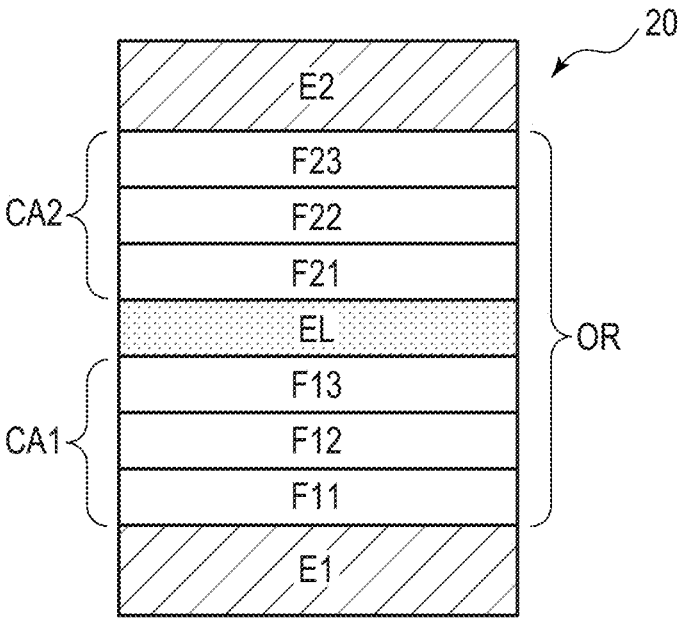
FIG. 2 is a view showing an example of a configuration of a display element 20.

Embodiments described herein aim to provide a display device and a display device manufacturing method capable of improving reliability.

In general, according to one embodiment, a display device comprises a substrate, a first insulating layer arranged on the substrate, a first lower electrode and a second lower electrode arranged on the first insulating layer, a second insulating layer arranged on the first insulating layer, and including a first opening which overlaps the first lower electrode and a second opening which overlaps the second lower electrode, a power supply line arranged on the second insulating layer, a first organic layer including a light emitting layer, arranged at the first opening, and covering the first lower electrode, a second organic layer including a light emitting layer, arranged at the second opening, and covering the second lower electrode, a first upper electrode being in contact with the power supply line, and covering the first organic layer, a second upper electrode being in contact with the power supply line, and covering the second organic layer, and a first inorganic insulating film covering the first upper electrode and the second upper electrode, and exposing the power supply line.

According to another embodiment, a display device manufacturing method comprises forming a lower electrode on a first insulating layer, forming a second insulating layer including an opening which penetrates to the lower electrode, forming a power supply line on the second insulating layer, forming a sacrificial layer on the power supply line, forming a partition on the sacrificial layer, forming an organic layer on the lower electrode, forming an upper electrode on the organic layer, forming a first inorganic insulating film on the upper electrode, and removing the sacrificial layer.

According to an embodiment, a display device and a display device manufacturing method capable of improving reliability can be provided.

Embodiments will be described hereinafter with reference to the accompanying drawings.

The disclosure is merely an example, and proper changes within the spirit of the invention, which are easily conceivable by a person of ordinary skill in the art, are included in the scope of the invention as a matter of course. In addition, in order to make the description clearer, the widths, thicknesses, shapes and the like, of the respective parts are schematically illustrated in the drawings, compared to the actual modes, in some cases. However, the schematic illustration is merely an example, and adds no restriction to the interpretation of the invention. In addition, in the specification and drawings, structural elements which function in the same or a similar manner to those described in connection with preceding drawings are denoted by like reference numbers, detailed description thereof being omitted unless necessary.

In the figures, an X-axis, a Y-axis and a Z-axis orthogonal to each other are described to facilitate understanding as needed. A direction along the X-axis is referred to as an X-direction or a first direction, a direction along the Y-axis is referred to as a Y-direction or a second direction, and a direction along the Z-axis is referred to as a Z-direction or a third direction. A plane defined by the X-axis and the Y-axis is referred to as an X-Y plane. Viewing the X-Y plane is referred to as plan view.

The display device DSP according to the embodiment is an organic electroluminescent display device comprising organic light emitting diodes (OLED) as display elements, and is mounted on televisions, personal computers, mobile terminals, mobile phones, and the like. The display element described below can be applied as a light emitting element of an illumination device, and the display device DSP can be applied to other electronic devices such as an illumination device.

FIG. 1 is a view showing a configuration example of the display device DSP according to the embodiment. The display device DSP comprises a display portion DA where images are displayed, on an insulating substrate 10. The substrate 10 may be glass or a flexible resin film.

The display portion DA comprises a plurality of pixels PX arrayed in a matrix in the first direction X and the second direction Y. The pixel PX comprises a plurality of sub-pixels SP1, SP2, and SP3. As an example, the pixel PX comprises a red sub-pixel SP1, a green sub-pixel SP2, and a blue sub-pixel SP3. In addition to the sub-pixels of the above three colors, the pixel PX may comprise four or more sub-pixels including a sub-pixel of the other color such as white.

A configuration example of one sub-pixel SP included in the pixel PX will be described simply.

In other words, the sub-pixel SP comprises a pixel circuit 1 and a display element 20 driven and controlled by the pixel circuit 1. The pixel circuit 1 comprises a pixel switch 2, a drive transistor 3, and a capacitor 4. The pixel switch 2 and the drive transistor 3 are, for example, switch elements constituted by thin-film transistors.

In the pixel switch 2, a gate electrode is connected to a scanning line GL, a source electrode is connected to a signal line SL, and a drain electrode is connected to one of electrodes constituting the capacitor 4 and a gate electrode of the drive transistor 3. In the drive transistor 3, a source electrode is connected to the other electrode constituting the capacitor 4 and a power line PL, and a drain electrode is connected to an anode of the display element 20. A cathode of the display element 20 is connected to a power supply line FL. The configuration of the pixel circuit 1 is not limited to the example shown in the figure.

The display element 20 is an organic light emitting diode (OLED) which is a light emitting element. For example, the sub-pixel SP1 comprises a display element that emits light corresponding to a red wavelength, the sub-pixel SP2 comprises a display element that emits light corresponding to a green wavelength, and the sub-pixel SP3 comprises a display element that emits light corresponding to a blue wavelength. The pixel PX can realize multicolor display by comprising a plurality of sub-pixels SP1, SP2, and SP3 of different display colors.

However, the pixel PX may also be configured such that the display element 20 of each of the sub-pixels SP1, SP2, and SP3 emits light of the same color. Monochromatic display can be thereby realized.

In addition, when the display element 20 of each of the sub-pixels SP1, SP2, and SP3 is configured to emit white light, a color filter opposed to the display element 20 may be arranged. For example, the sub-pixel SP1 may comprise a red color filter opposed to the display element 20, the sub-pixel SP2 may comprise a green color filter opposed to the display element 20, and the sub-pixel SP3 may comprise a blue color filter opposed to the display element 20. Multicolor display can be thereby realized.

Alternatively, when the display element 20 of each of the sub-pixels SP1, SP2, and SP3 is configured to emit ultra-violet light, multicolor display can be realized by arranging a light conversion layer opposed to the display element 20.

FIG. 2 is a view showing an example of a configuration of the display element 20.

The display element 20 comprises a lower electrode (first electrode) E1, an organic layer OR, and an upper electrode (second electrode) E2. The organic layer OR includes a carrier adjustment layer (first carrier adjustment layer) CA1, a light emitting layer EL, and a carrier adjustment layer (second carrier adjustment layer) CA2. The carrier adjustment layer CA1 is located between the lower electrode E1 and the light emitting layer EL, and the carrier adjustment layer CA2 is located between the light emitting layer EL and the upper electrode E2. The carrier adjustment layers CA1 and CA2 include a plurality of functional layers.

An example in which the lower electrode E1 corresponds to an anode and the upper electrode E2 corresponds to a cathode will be described.

The carrier adjustment layer CA1 includes a hole injection layer F11, a hole transport layer F12, an electron blocking layer F13, and the like, as functional layers. The hole injection layer F11 is arranged on the lower electrode E1, the hole transport layer F12 is arranged on the hole injection layer F11, the electron blocking layer F13 is arranged on the hole transport layer F12, and the light emitting layer EL is arranged on the electron blocking layer F13.

The carrier adjustment layer CA2 includes a hole blocking layer F21, an electron transport layer F22, an electron injection layer F23, and the like, as functional layers. The hole blocking layer F21 is arranged on the light emitting layer EL, the electron transport layer F22 is arranged on the hole blocking layer F21, the electron injection layer F23 is arranged on the electron transport layer F22, and the upper electrode E2 is arranged on the electron injection layer F23.

In addition to the functional layers described above, the carrier adjustment layers CA1 and CA2 may also include the other functional layers such as a carrier generation layer as needed or at least one of the above functional layers may be omitted in the carrier adjustment layers CA1 and CA2.

FIG. 3 is a plan view showing an example of the pixel PX shown in FIG. 1.

Each of the sub-pixels SP1, SP2, and SP3 constituting one pixel PX is shaped in a substantially rectangular shape extending in the second direction Y, and the sub-pixels are arranged in the first direction X. An outer shape of each sub-pixel corresponds to an outer shape of the light emission area EA at the display element 20, but is simplified in the drawing and an actual shape may not be reflected on the outer shape. It is assumed here that the light emission area EA is formed in a rectangular shape having short sides extending in the first direction X and long sides extending in the second direction Y.

An insulating layer 12 to be described later is formed in a grating shape extending in each of the first direction X and the second direction Y, and surrounds each of the sub-pixels SP1, SP2, and SP3 or the display element 20 of each of the sub-pixels. The insulating layer 12 includes a plurality of openings OP including openings OP1 and OP2. The light emission area EA is formed at the openings OP of insulating layer 12.

A power supply line FL is formed in a grating shape extending in each of the first direction X and the second direction Y and is arranged on the insulating layer 12, in plan view. Each of the sub-pixels SP1, SP2, and SP3 is sur-rounded by the power supply line FL.

The upper electrodes E2 of the display element 20 are in contact with the power supply line FL as represented by a one-dot chain line. A predetermined electric potential is thereby supplied from the power supply line FL to the upper electrodes E2.

Figure 4:
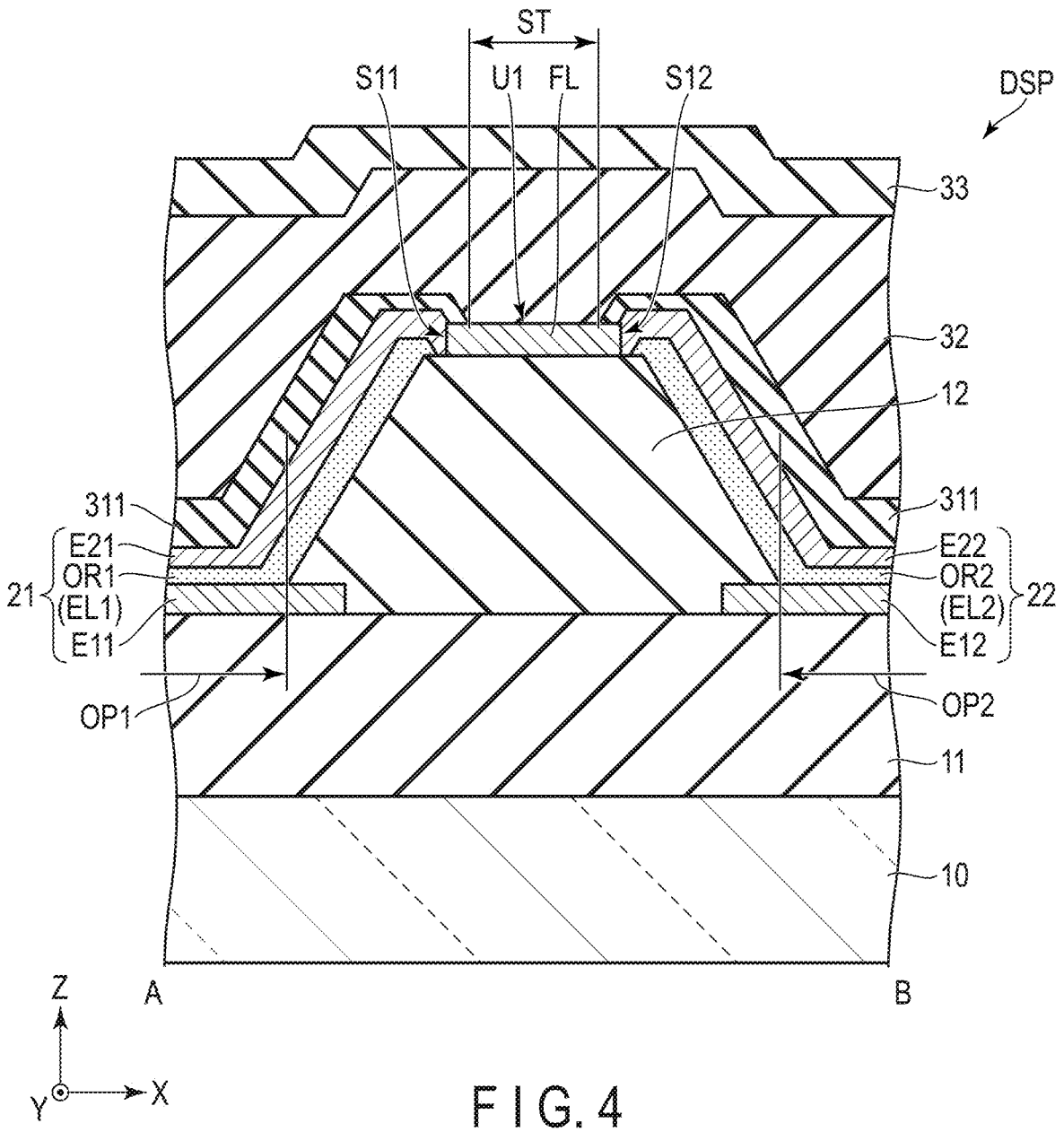
FIG. 4 is a cross-sectional view showing the display device DSP along line A-B shown in FIG. 3.

FIG. 4 is a cross-sectional view showing the display device DSP along line A-B shown in FIG. 3.

Two display elements adjacent in the first direction X will be focused. The display element located on the left side of the drawing is referred to as a display element 21, and the display element located on the right side of the drawing is referred to as a display element 22, for convenience.

The display element 21 comprises a lower electrode (first lower electrode) E11, an organic layer (first organic layer) OR1, and an upper electrode (first upper electrode) E21.

The display element 22 comprises a lower electrode (second lower electrode) E12, an organic layer (second organic layer) OR2, and an upper electrode (second upper electrode) E22.

The insulating layer (first insulating layer) 11 corresponds to an underlying layer of the display elements 21 and 22. The insulating layer (second insulating layer) 12 is arranged on the insulating layer 11. The insulating layers 11 and 12 are, for example, organic insulating layers.

The lower electrodes E11 and E12 are arranged on the insulating layer 11 and are arranged at intervals in the first direction X. Each of the lower electrodes E11 and E12 is the electrode arranged for each sub-pixel or each display element, and is electrically connected to the drive transistor 3 shown in FIG. 1. The lower electrodes E11 and E12 are referred to as pixel electrodes, anodes, or the like in some cases.

The lower electrodes E11 and E12 are transparent electrodes formed of, for example, a transparent conductive material such as indium tin oxide (ITO) or indium zinc oxide (IZO). The lower electrodes E11 and E12 may be metal electrodes formed of a metal material such as silver or aluminum. Alternatively, the lower electrodes E11 and E12 may be stacked layer bodies of transparent electrodes and metal electrodes. For example, the lower electrodes E11 and E12 may be constituted as stacked layer bodies formed by stacking a transparent electrode, a metal electrode, and a transparent electrode, in this order, or may be constituted as stacked layer bodies of three or more layers.

The insulating layer 12 is arranged between the lower electrode E11 and the lower electrode E12. In addition, the insulating layer 12 includes an opening OP1 and an opening OP2. The insulating layer 12 is formed to partition sub-pixels or display elements 21 and 22, and is referred to as a rib, partition, a bank, or the like in some cases.

The opening OP1 is a through hole which is formed in an area overlapping the lower electrode E11 and which penetrates the insulating layer 12 to the lower electrode E11. A peripheral part of the lower electrode E11 is covered with the insulating layer 12, and a central part of the lower electrode E11 is exposed from the insulating layer 12 at the opening OP1.

The opening OP2 is a through hole which is formed in an area overlapping the lower electrode E12 and which penetrates the insulating layer 12 to the lower electrode E12. A peripheral part of the lower electrode E12 is covered with the insulating layer 12, and a central part of the lower electrode E12 is exposed from the insulating layer 12 at the opening OP2.

The organic layer OR1 includes a light emitting layer EL1. The organic layer OR1 is arranged at the opening OP1 to cover the lower electrode E11.

The organic layer OR2 includes a light emitting layer EL2. The light emitting layer EL2 may be formed of the same material as the light emitting layer EL1 (the organic layer OR1 and the organic layer OR2 emit light of the same color) or may be formed of a material different from that of the light emitting layer EL1 (the organic layer OR1 and the organic layer OR2 emit light of different colors). The organic layer OR2 is arranged at the opening OP2 to cover the lower electrode E12. On the insulating layer 12, the organic layer OR2 is separated from the organic layer OR1.

The power supply line FL is arranged on the insulating layer 12 and located between the organic layer OR1 and the organic layer OR2. The power supply line FL is separated from the organic layer OR1 and the organic layer OR2. The power supply line FL has a first side surface S11 that faces the opening OP1, a second side surface S12 that faces the opening OP2, and an upper surface U1.

The upper electrode E21 is arranged on the organic layer OR1 to cover an entire body of the organic layer OR1 including a peripheral part of the organic layer OR1. A part of the organic layer OR1, which is located between the lower electrode E11 and the upper electrode E21, not through the insulating layer 12, can form a light emission area of the display element 21. A part of the organic layer OR1, which is located between the insulating layer 12 and the upper electrode E21, hardly emits light.

The upper electrode E22 is arranged on the organic layer OR2 to cover an entire body of the organic layer OR2 including a peripheral part of the organic layer OR2. The upper electrode E22 is separated from the upper electrode E21. A part of the organic layer OR2, which is located between the lower electrode E12 and the upper electrode E22, not through the insulating layer 12, can form a light emission area of the display element 22. A part of the organic layer OR2, which is located between the insulating layer 12 and the upper electrode E22, hardly emits light.

The power supply line FL is located between the upper electrode E21 and the upper electrode E22. On the insulating layer 12, the upper electrode E21 and the upper electrode E22 are in contact with the power supply line FL. In the example shown in FIG. 4, the upper electrode E21 is in contact with the first side surface S11, and the upper electrode E22 is in contact with the second side surface S12. The upper surface U1 is exposed from the upper electrode E21 and the upper electrode E22.

In addition, the upper electrode E21 is in contact with the insulating layer 12 at a position between the organic layer OR1 and the power supply line FL. The upper electrode E22 is in contact with the insulating layer 12 at a position between the organic layer OR2 and the power supply line FL.

The upper electrodes E21 and E22 are the electrodes arranged for each sub-pixel or each display element. Since each of the electrodes is in contact with the power supply line FL, they are electrically connected to each other. The upper electrodes E21 and E22 are referred to as common electrodes, counter-electrodes, cathodes or the like in some cases.

The upper electrodes E21 and E22 are, for example, transflective metal electrodes formed of a metal material such as magnesium and silver. The upper electrodes E21 and E22 may be transparent electrodes formed of a transparent conductive material such as ITO or IZO. Alternatively, the upper electrodes E21 and E22 may be stacked layer bodies of transparent electrodes and metal electrodes.

In one example, the thickness of the organic layer OR1 along the third direction Z is set such that the peak wavelength of the emission spectrum in the light emitting layer EL1 matches the effective optical path length between the lower electrode E11 and the upper electrode E21. A micro-cavity structure for obtaining a resonance effect is thereby realized. Similarly, the thickness of the organic layer OR2 along the third direction Z is set such that the peak wavelength of the emission spectrum in the light emitting layer EL2 matches the effective optical path length between the lower electrode E12 and the upper electrode E22.

A first inorganic insulating film 311 covers the upper electrode E21 and the upper electrode E21, is in contact with a part of the upper surface U1, and exposes the power supply line FL. In other words, the first inorganic insulating film 311 includes a slit ST which overlaps the upper surface U1. The first inorganic insulating film 311 is formed of, for example, a silicon nitride, a silicon oxide or the like.

An organic insulating film 32 covers the first inorganic insulating film 311, and is in contact with the power supply line FL between the upper electrode E21 and the upper electrode E21 or in the slit ST of the first inorganic insulating film 311. A thickness of the organic insulating film 32 is larger than a thickness of the first inorganic insulating film 311.

An inorganic insulating film 33 covers the organic insulating film 32. The first inorganic insulating film 311, the organic insulating film 32, and the inorganic insulating film 33 constitute a sealing layer to protect the display elements 21 and 22 from moisture and the like.

Figure 5:
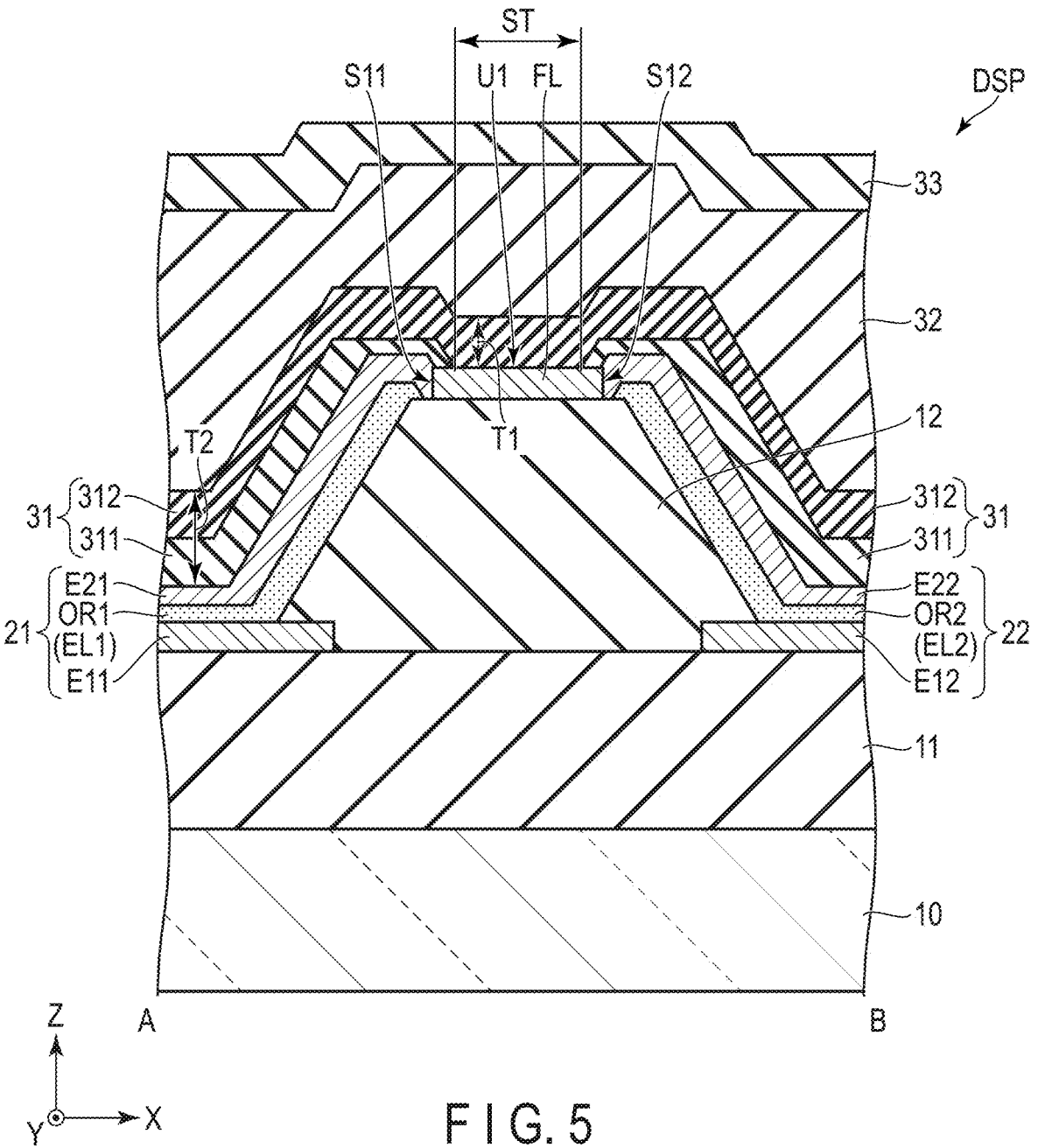
FIG. 5 is a cross-sectional view showing another display device DSP along line A-B shown in FIG. 3.

FIG. 5 is a cross-sectional view showing another display device DSP along line A-B shown in FIG. 3.

The example shown in FIG. 5 is different from the example shown in FIG. 4 in that a second inorganic insulating film 312 covering the first inorganic insulating film 311 is provided. The second inorganic insulating film 312 covers the first inorganic insulating film 311, and is in contact with the power supply line FL between the upper electrode E21 and the upper electrode E22 or in the slit ST of the first inorganic insulating film 311. The organic insulating film 32 covers the second inorganic insulating film 312. The inorganic insulating film 33 covers the organic insulating film 32.

The second inorganic insulating film 312 may be formed of the same material as the first inorganic insulating film 311 or may be formed of a material different from the first inorganic insulating film 311. As an example, the first inorganic insulating film 311 and the second inorganic insulating film 312 are formed of a silicon nitride. When the first inorganic insulating film 311 and the second inorganic insulating film 312 are regarded as a single inorganic insulating film 31, a thickness T1 of the inorganic insulating film 31 at a position of being in contact with the power supply line FL is smaller than a thickness T2 of the inorganic insulating film 31 at a position of overlapping the upper electrode E21 (T1<T2).

Next, a method of manufacturing the display device DSP including the above-described display elements 21 and 22 will be described simply with reference to FIG. 6 and FIG. 7.

Figure 6:
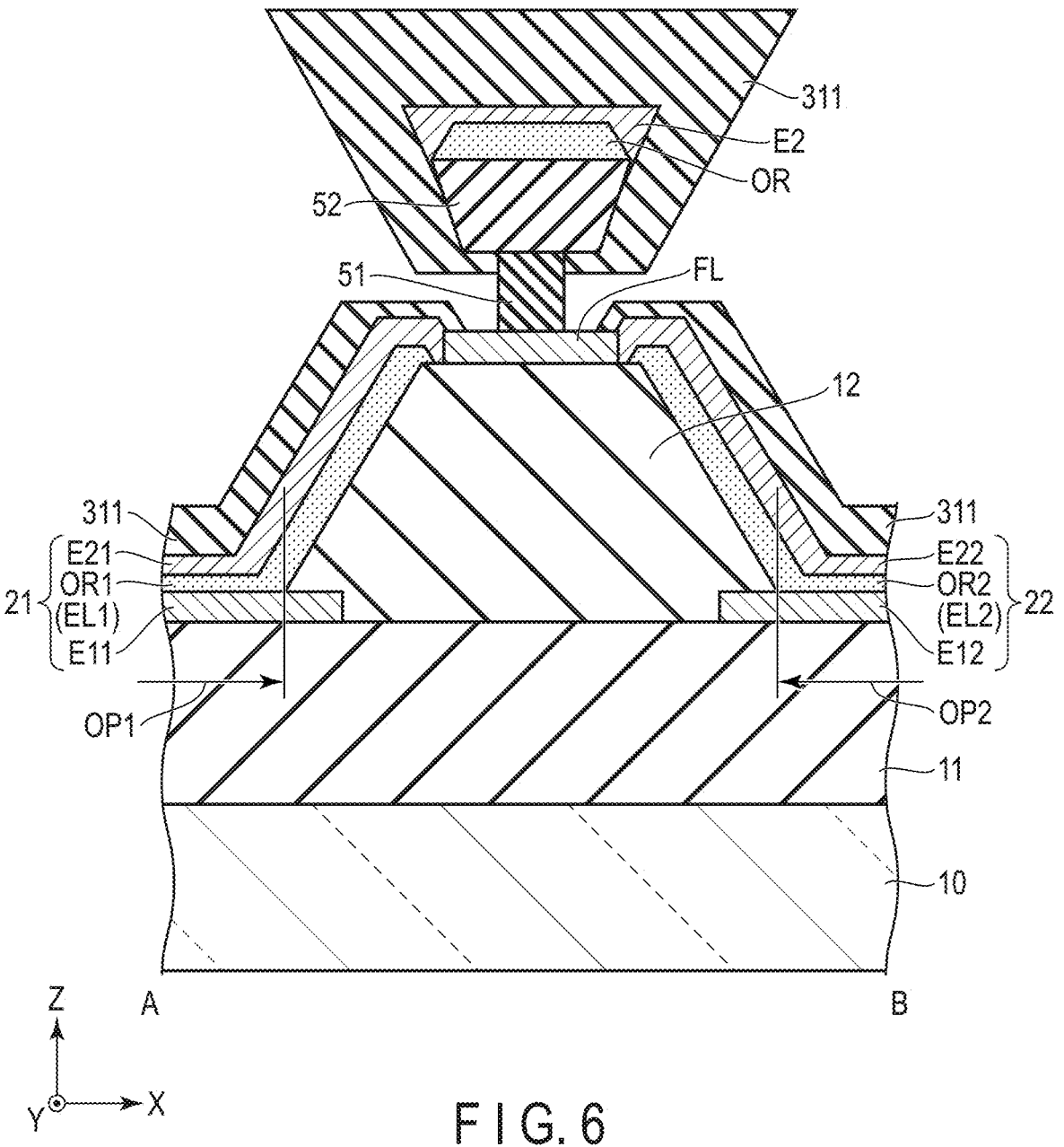
FIG. 6 is a view illustrating a method of manufacturing the display device DSP.

First, as shown in FIG. 6, after the lower electrodes E11 and E12 are formed on the insulating layer 11, the organic insulating layer is formed, and the insulating layer 12 including the openings OP1 and OP2 is formed by patterning the organic insulating layer. After that, the metal layer is formed, and the power supply line FL is formed by patterning the metal layer.

Subsequently, after the metal layer or the insulating layer is formed, a sacrificial layer 51 is formed on the power supply line FL by patterning. Furthermore, after at least one of the metal layer and the insulating layer is formed, a partition 52 is formed on the sacrificial layer 51 by patterning. The partition 52 has a cross-sectional shape protruding from the sacrificial layer 51 toward the opening OP1, and protruding from the sacrificial layer 51 toward the opening OP2.

After that, each layer constituting the organic layer OR is formed by, for example, vapor deposition. At this time, the organic layers OR1 and OR2 are formed at the openings OP1 and OP2, respectively, and the organic layer OR is formed on the partition 52. In other words, the organic layers OR1 and OR2 separated from each other are formed without using a fine mask.

After that, the upper electrode E2 is formed by, for example, sputtering or vapor deposition. At this time, the upper electrodes E21 and E22 are formed at the openings OP1 and OP2, respectively, and the upper electrode E2 is formed on the partition 52. In other words, the upper electrodes E21 and E22 separated from each other are formed without using a fine mask.

A radiation angle of the material for forming the upper electrode E2 is larger than a radiation angle of the material for forming the organic layer OR. For this reason, the material for forming the organic layer OR hardly reaches the lower side of the partition 52, and exposes the power supply line FL. In contrast, the material for forming the upper electrode E2 also stretches to an area behind the partition 52. The upper electrodes E21 and E22 which are in contact with the power supply line FL are thereby formed.

Subsequently, the first inorganic insulating film 311 covering each of the upper electrodes E21 and E22 is formed. At this time, the first inorganic insulating film 311 is also formed on the partition 52. The sacrificial layer 51 is exposed from the first inorganic insulating film 311.

After that, the sacrificial layer 51 is removed as shown in FIG. 7. Therefore, the partition 52 on which the organic layer OR and the like are deposited is also removed. The upper surface U1 of the power supply line FL is exposed by removing the sacrificial layer 51.

Then, after the sacrificial layer 51 is removed, the organic insulating film 32 is formed on the first inorganic insulating film 311 and on the power supply line FL, the inorganic insulating film 33 is formed on the organic insulating film 32, and the display device DSP having the structure shown in FIG. 4 is thereby manufactured.

Alternatively, after the sacrificial layer 51 is removed, the second inorganic insulating film 312 is formed on the first inorganic insulating film 311 and on the power supply line FL, then the organic insulating film 32 is formed on the second inorganic insulating film 312, the inorganic insulating film 33 is further formed on the organic insulating film 32, and the display device DSP having the structure shown in FIG. 5 is thereby manufactured.

As described above, the organic layer OR formed not through a fine mask is divided by the partition 52. For this reason, the display element 20 comprising the organic layer OR formed in a desired shape is provided. For this reason, the manufacturing costs can be reduced as compared with a case where a fine mask is applied, and processes such as positioning a fine mask are not required, and the organic layer OR in a desired shape can easily be formed. In addition, the light emission area can be formed in predetermined areas and undesired light emission in the areas overlapping the insulating layer 12 is suppressed, in the display element 20.

In addition, the upper electrode E2 is also divided by the partition 52, similarly to the organic layer OR, and each upper electrode E2 is in contact with the power supply line FL located under the partition 52. In addition, for the power supply line FL arranged to surround the upper electrode E2, a substantially entire body of the peripheral part of the upper electrode E2 is in contact with the power supply line FL. For this reason, an area of contact between the upper electrode E2 and the power supply line FL can be secured in a sufficient size, and a predetermined electric potential can be supplied to the entire surface of the upper electrode E2.

In addition, after each display element 20 is covered with the first inorganic insulating film 311, the partition 52 is removed together with the sacrificial layer 51, and then the display element is sealed by the organic insulating film 32 and the inorganic insulating film 33. Step parts of the power supply line FL are reduced, occurrence of undesired air bubbles is suppressed, and crack of the sealing layer can be suppressed as compared with a case of forming the organic insulating film 32 in a state in which the partition 52 remains. The reliability can be therefore improved.

In addition, since the partition 52 surrounding the light emission area is removed, the light emitted from the light emission area spreads and the viewing angle is extended as compared with a case where the partition 52 remains.

Figure 8:
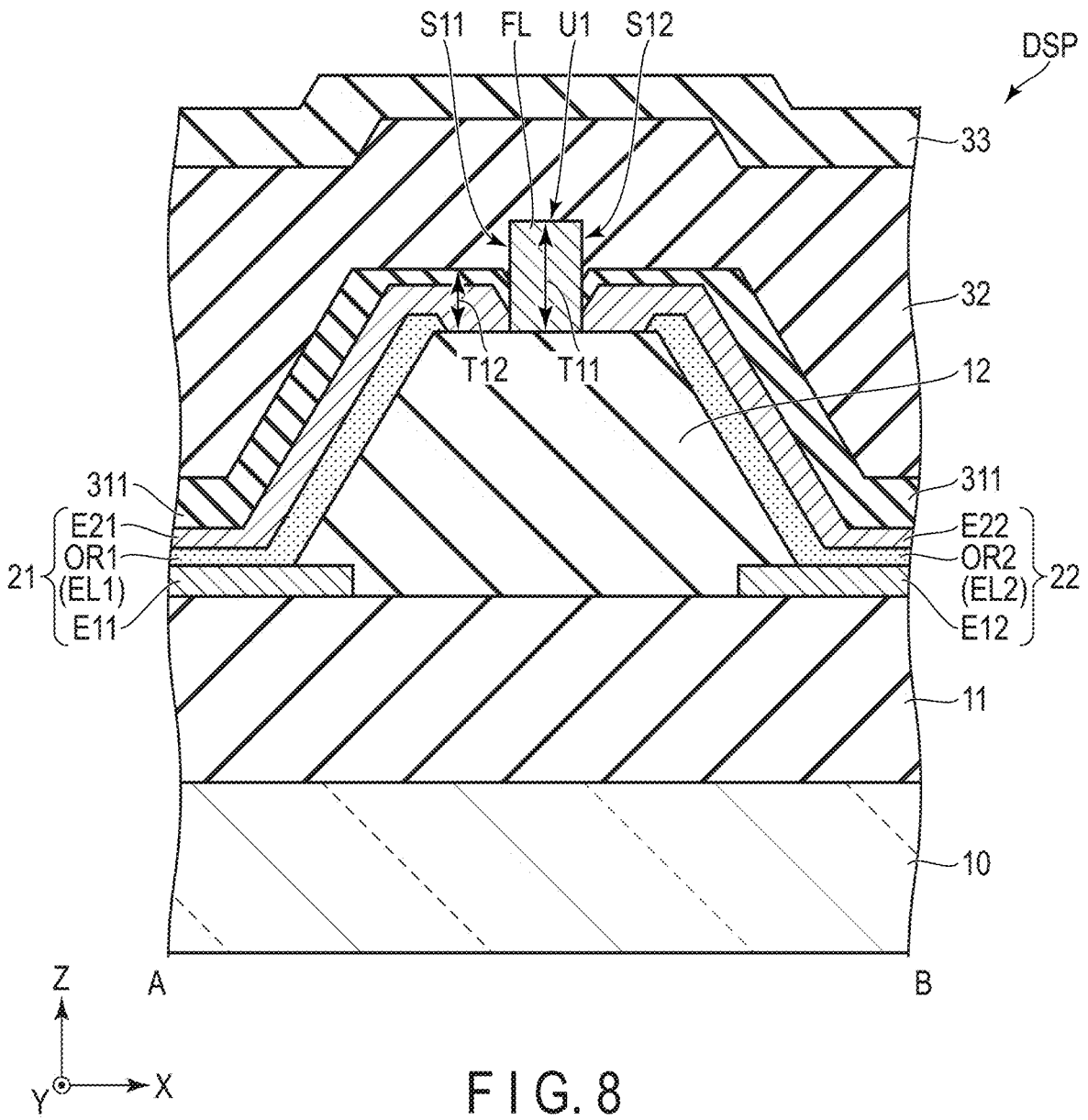
FIG. 8 is a cross-sectional view showing another display device DSP along line A-B shown in FIG. 3.

FIG. 8 is a cross-sectional view showing another display device DSP along line A-B shown in FIG. 3.

The example shown in FIG. 8 is different from the example shown in FIG. 4 in the shape of the power supply line FL. A thickness T11 of the power supply line FL is larger than a sum T12 of the thicknesses of the upper electrode E21 and the first inorganic insulating film 311 that overlap between the first organic layer OR1 and the first inorganic insulating film 311 (T11>T12). In other words, the power supply line FL protrudes upwardly from the first inorganic insulating film 311.

The upper electrode E21 and the first inorganic insulating film 311 are in contact with the first side surface S11, the upper electrode E22 and the first inorganic insulating film 311 are in contact with the second side surface S12, and the upper surface U1 is exposed from the first inorganic insulating film 311.

The organic insulating film 32 covers the first inorganic insulating film 311, and also covers the power supply line FL protruding from the first inorganic insulating film 311. In other words, the organic insulating film 32 is in contact with the first side surface S11, the second side surface S12, and the upper surface U1 of the power supply line FL.

Figure 9:
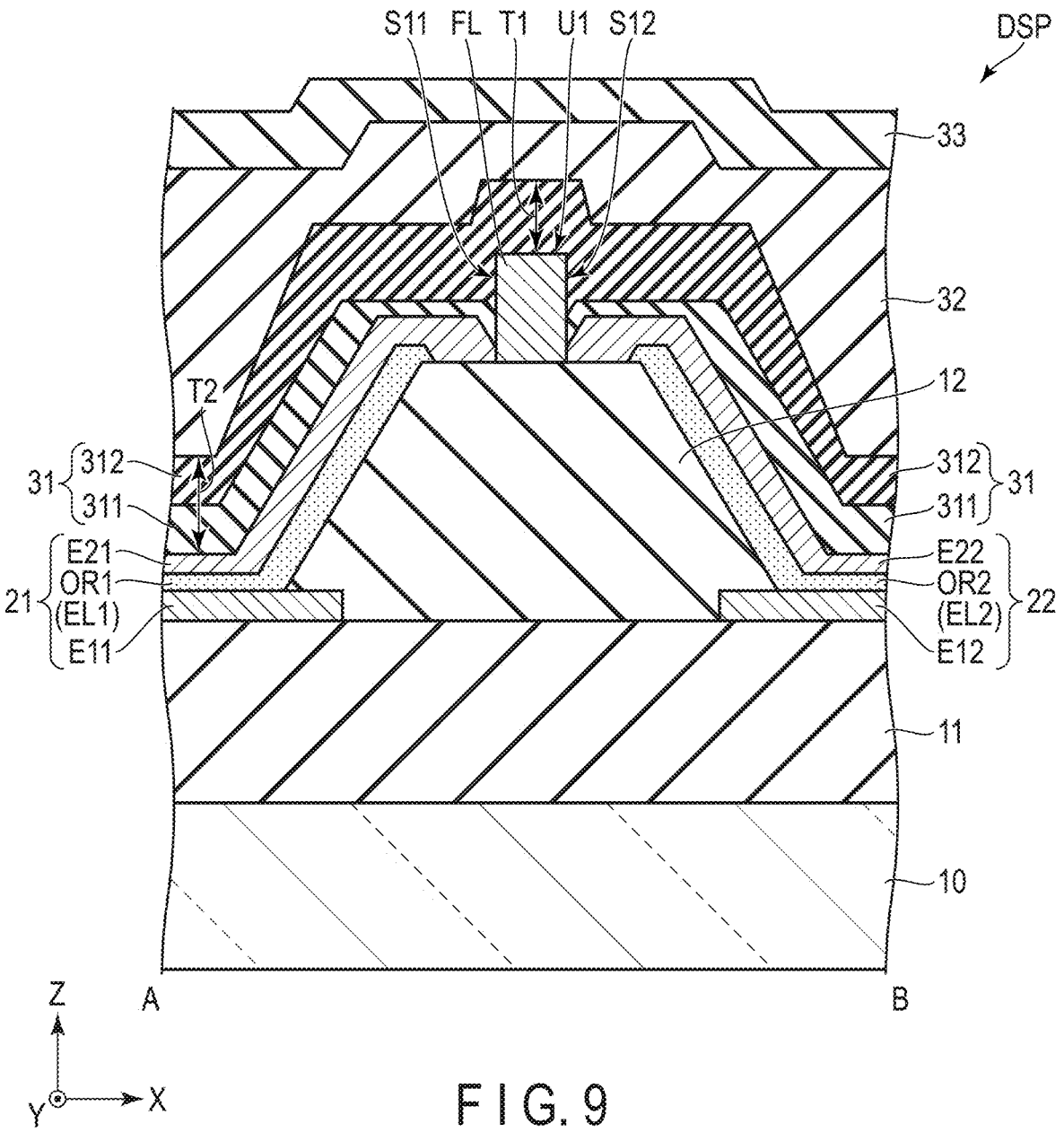
FIG. 9 is a cross-sectional view showing another display device DSP along line A-B shown in FIG. 3.

FIG. 9 is a cross-sectional view showing another display device DSP along line A-B shown in FIG. 3.

The example shown in FIG. 9 is different from the example shown in FIG. 8 in that the second inorganic insulating film 312 covering the first inorganic insulating film 311 is provided. The second inorganic insulating film 312 covers the first inorganic insulating film 311, and also covers the power supply line FL protruding from the first inorganic insulating film 311. In other words, the second inorganic insulating film 312 is in contact with the first side surface S11, the second side surface S12, and the upper surface U1 of the power supply line FL. The organic insulating film 32 covers the second inorganic insulating film 312. The inorganic insulating film 33 covers the organic insulating film 32.

When the first inorganic insulating film 311 and the second inorganic insulating film 312 are regarded as a single inorganic insulating film 31, a thickness T1 of the inorganic insulating film 31 at a position of being in contact with the upper surface U1 of the power supply line FL is smaller than a thickness T2 of the inorganic insulating film 31 at a position of overlapping the upper electrode E21 (T1<T2).

Next, a method of manufacturing the display device DSP including the above-described display elements 21 and 22 will be described simply with reference to FIG. 10 and FIG. 11.

Figure 10:
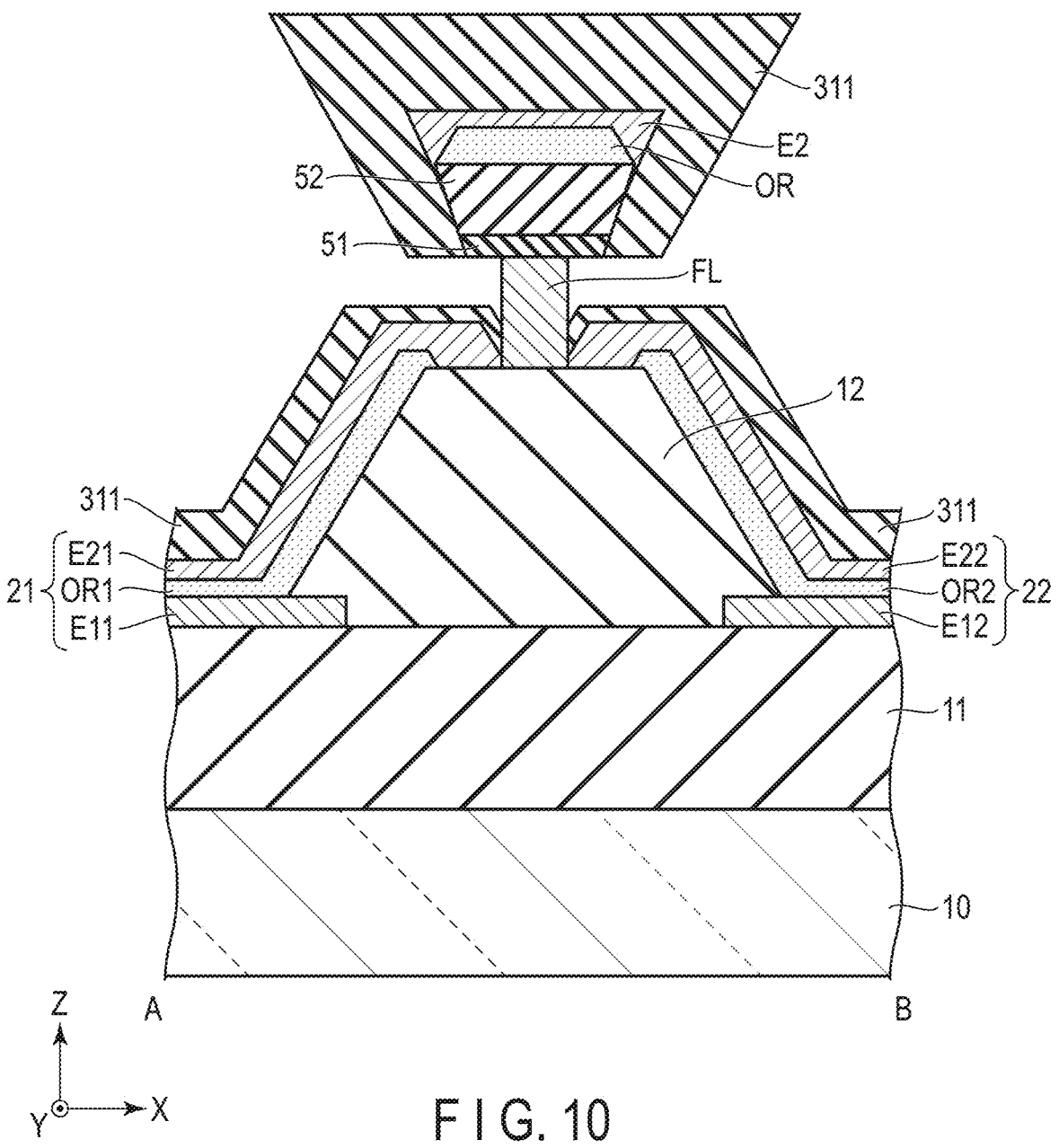
FIG. 10 is a view illustrating a method of manufacturing the display device DSP.

First, as shown in FIG. 10, the insulating layer 12 is formed, after the lower electrodes E11 and E12 are formed on the insulating layer 11. After that, the metal layer is formed, and the power supply line FL is formed by patterning the metal layer.

Subsequently, the sacrificial layer 51 is formed on the power supply line FL, and the partition 52 is formed on the sacrificial layer 51. The sacrificial layer 51 and the partition 52 can be formed by, for example, wholly patterning multilayer bodies formed of predetermined materials. The sacrificial layer 51 and the partition 52 have a cross-sectional shape protruding from the power supply line FL toward the opening OP1, and protruding from the power supply line FL toward the opening OP2.

After that, each layer constituting the organic layer OR is formed by, for example, vapor deposition. At this time, the organic layers OR1 and OR2 are formed at the openings OP1 and OP2, respectively, and the organic layer OR is formed on the partition 52.

After that, the upper electrode E2 is formed by, for example, sputtering or vapor deposition. At this time, the upper electrodes E21 and E22 are formed at the openings OP1 and OP2, respectively, and the upper electrode E2 is formed on the partition 52.

Subsequently, the first inorganic insulating film 311 covering each of the upper electrodes E21 and E22 is formed. At this time, the first inorganic insulating film 311 is also formed on the partition 52.

After that, the sacrificial layer 51 is removed as shown in FIG. 11. Therefore, the partition 52 on which the organic layer OR and the like are deposited is also removed.

After that, the organic insulating film 32 is formed on the first inorganic insulating film 311 and on the power supply line FL, the inorganic insulating film 33 is formed on the organic insulating film 32, and the display device DSP having the structure shown in FIG. 8 is thereby manufactured.

Alternatively, after the sacrificial layer 51 is removed, the second inorganic insulating film 312 is formed on the first inorganic insulating film 311 and on the power supply line FL, then the organic insulating film 32 is formed on the second inorganic insulating film 312, the inorganic insulating film 33 is further formed on the organic insulating film 32, and the display device DSP having the structure shown in FIG. 9 is thereby manufactured.

In the examples shown in FIG. 8 and FIG. 9, the same advantages as those described above can also be obtained.

According to the above-described embodiments, a display device and a display device manufacturing method capable of improving reliability can be provided.

All of the display devices that can be implemented by a person of ordinary skill in the art through arbitrary design changes to the display devices described above as embodiments of the present invention come within the scope of the present invention as long as they are in keeping with the spirit of the present invention.

Various types of the modified examples are easily conceivable within the category of the ideas of the present invention by a person of ordinary skill in the art and the modified examples are also considered to fall within the scope of the present invention. For example, additions, deletions or changes in design of the constituent elements or additions, omissions, or changes in condition of the processes arbitrarily conducted by a person of ordinary skill in the art, in the above embodiments, fall within the scope of the present invention as long as they are in keeping with the spirit of the present invention.

In addition, the other advantages of the aspects described in the embodiments, which are obvious from the descriptions of the present specification or which can be arbitrarily conceived by a person of ordinary skill in the art, are considered to be achievable by the present invention as a matter of course.

What is claimed is:

1. A display device comprising:

a substrate;

a first insulating layer arranged on the substrate;

a first lower electrode and a second lower electrode arranged on the first insulating layer;

a second insulating layer arranged on the first insulating layer, and including a first opening which overlaps the first lower electrode and a second opening which overlaps the second lower electrode;

a power supply line arranged on the second insulating layer;

a first organic layer including a light emitting layer, arranged at the first opening, and covering the first lower electrode;

a second organic layer including a light emitting layer, arranged at the second opening, and covering the second lower electrode;

a first upper electrode being in contact with the power supply line, and covering the first organic layer;

a second upper electrode being in contact with the power supply line, and covering the second organic layer; and a first inorganic insulating film covering the first upper electrode and the second upper electrode, and exposing the power supply line.

2. The display device of claim 1, further comprising:

an organic insulating film covering the first inorganic insulating film, and being in contact with the power supply line between the first upper electrode and the second upper electrode.

3. The display device of claim 1, further comprising:

a second inorganic insulating film covering the first inorganic insulating film, and being in contact with the power supply line between the first upper electrode and the second upper electrode; and an organic insulating film covering the second inorganic insulating film.

4. The display device of claim 1, wherein the power supply line has a first side surface which is in contact with the first upper electrode, a second side surface which is in contact with the second upper electrode, and an upper surface which is in contact with the first inorganic insulating film.

5. The display device of claim 1, wherein the power supply line has a first side surface which is in contact with the first upper electrode and the first inorganic insulating film, and a second side surface which is in contact with the second upper electrode and the first inorganic insulating film.

6. A display device manufacturing method comprising:

forming a lower electrode on a first insulating layer;

forming a second insulating layer including an opening which penetrates to the lower electrode;

forming a power supply line on the second insulating layer;

forming a sacrificial layer on the power supply line;

forming a partition on the sacrificial layer;

forming an organic layer on the lower electrode;

forming an upper electrode on the organic layer;

forming a first inorganic insulating film on the upper electrode; and removing the sacrificial layer.

7. The display device manufacturing method of claim 6, comprising:

forming an organic insulating film on the first inorganic insulating film and on the power supply line after removing the sacrificial layer.

8. The display device manufacturing method of claim 6, comprising:

forming a second inorganic insulating film on the first inorganic insulating film and on the power supply line after removing the sacrificial layer; and forming an organic insulating film on the second inorganic insulating film.

* * * * *